United States Patent [19]

Gibbs et al.

[11] Patent Number: 4,987,363
[45] Date of Patent: Jan. 22, 1991

[54] ELECTRIC ENERGY METER WITH POWER OUTAGE RECOVERY CIRCUIT

[75] Inventors: Danny R. Gibbs, Lafayette; Patrick A. Burgess, West Point; William J. Kurklis; Mark A. Harger, both of Lafayette, all of Ind.

[73] Assignee: Landis & GYR Metering, Inc., Lafayette, Ind.

[21] Appl. No.: 411,854

[22] Filed: Sep. 25, 1989

[51] Int. Cl.⁵ .................. G01R 21/00; G01R 22/00
[52] U.S. Cl. .................................. 324/142; 364/483; 377/32; 365/228
[58] Field of Search ............... 365/228, 229, 230; 377/30, 32; 307/296.4, 296.5, 66; 324/142; 364/483, 481; 368/48

[56] References Cited

U.S. PATENT DOCUMENTS

| | | | |
|---|---|---|---|
| 4,197,582 | 4/1980 | Johnston et al. | 324/142 |
| 4,323,987 | 4/1982 | Holtz et al. | 365/229 |
| 4,355,361 | 10/1982 | Riggs et al. | 364/483 |
| 4,400,783 | 8/1983 | Locke, Jr. et al. | 364/483 |
| 4,458,307 | 7/1984 | McAnlis et al. | 365/228 |
| 4,525,800 | 6/1985 | Hamerla | 364/900 |

Primary Examiner—Reinhard J. Eisenzopf
Assistant Examiner—William J. Burns
Attorney, Agent, or Firm—Woodard, Emhardt, Naughton Moriarty & McNett

[57] ABSTRACT

A time registering electric energy meter for measuring usage of an AC energy quantity includes primary and secondary DC power supplies and a microprocessor, having a realtime clock maintained by the 60 Hz AC energy quantity, for maintaining realtime and for generating AC energy usage information determined by a number of time-related events. The meter further includes power outage recovery circuitry for measuring the duration of an outage of the AC energy quantity and for restoring the amount of lost realtime to the realtime clock of the microprocessor upon resumption of the AC energy quantity. The power outage recovery circuitry includes apparatus for iteratively updating the microprocessor realtime clock while comparing the updated realtime with the clock calendar times of the number of time-related events to account for the occurrence of such events during the outage of the AC energy quantity.

15 Claims, 4 Drawing Sheets

ELECTRIC ENERGY METER WITH POWER OUTAGE RECOVERY CIRCUIT

BACKGROUND OF THE INVENTION

This invention relates to AC electric energy meters which include a programmable time-based electric energy measuring system for performing various metering operations and relating those operations to realtime. More particularly, the invention relates to power outage recovery circuits for use with electric energy meters of this type.

Electric energy meters are extensively used for measuring electric energy usage at an AC power consumer's facility. Several types of meters may be used at the facility, including demand registers, time-of-use meters and tariff registers. Tariff meters or registers establish the amount of electric energy consumption for billing by the electric energy supplier. Most tariff meters provide for measuring the total comsumption of electric energy over a billing perid or for measuring a maximum or peak demand or usage during a particular time period. Many tariff meters are capable of performing AC energy comsumption or useage calculations at specific intervals or on the occurrence of specific time-related events.

In recent years, the electric energy meters have moved away from the traditional electromechanical type of meters to the more sophisticated and flexible electronic demand and tariff registers. These electronic registers measure AC electric energy usage in a manner similar to that of the prior electromechanical types. The electronic registers present the advantage of being able of program specific time-related events for purposes of adjusting billings or adjusting usage calculations. The electronic demand registers may also be pre-programmed to respond at specific time intervals in order to calculate and/or communicate various time-of-use information. Most frequently, these time-related events are stored in a memory in the meter electronics as clock calendar times—that is, by second, minute, hour, day and date. One disadvantage of the electronic register is that the register is susceiptible to problems in the event of an AC power outage or power failure. Since the electronic demand registers include electronic circuitry and electronic memories, some DC power is required by the electronic components in order to function or to maintain data stored within electronic memory.

Various devices of the prior art have suggested means for accounting for power outages at the electric energy meter. Particularly, these prior devices provide some means for maintaining the functions of the electrical components at a reduced current level, such as through a secondary DC power supply. Many of these devices utlize non-volatile memory for the storage of critical times or time-based information. For instance, the patent to Johnston, et al., U.S. Pat. No. 4,197,582, shows an electric energy meter which includes a non-volatile data memory for processing time-related data and which further includes an auxiliary DC supply energized by a battery which is used to power a low power secondary timer to maintain the current time and calendar registrations during the power outage. The patent to Stokes, et al., U.S. Pat. No. 4,701,858, illustrates another example of a electronic time-of-use utility meter having a non-volatile realtime clock calendar module for maintaining realtime during a power outage.

Other devices using similar power outage and power backup schemes are shown in the following patents: Sciulli, U.S. Pat. No. 4,495,596; Jerrim, U.S. Pat. No. 4,335,447; Dimassimo, et al., U.S. Pat. No. 4,465,970; and Wolf, U.S. Pat. No. 4,291,375.

The approaches taken in many of the prior art devices have several shortcomings. For instance, the devices that utilize a lower power timer to periodically perform housekeeping functions in the electronic demand register do not include a "catchup" mode in which the register, in essence, replays the time lost during the power outage in order to determine whether a time-related event has occurred. Other proposed solutions, such as a separate clock calendar computer chip are expensive and require a larger meter package.

In view of these and other limitations of proposed prior art solutions, there is a need for an electric energy meter having power fail timekeeping and recovery functions that is inexpensive and easily packaged, preferably as software rather than hardware. In addition, there is also a need for an electric energy meter with these functions that is capable of accounting for all time-related events that may have occurred during a power outage.

DESCRIPTION OF THE PREFERRED EMBODIMENT

Figure 1:
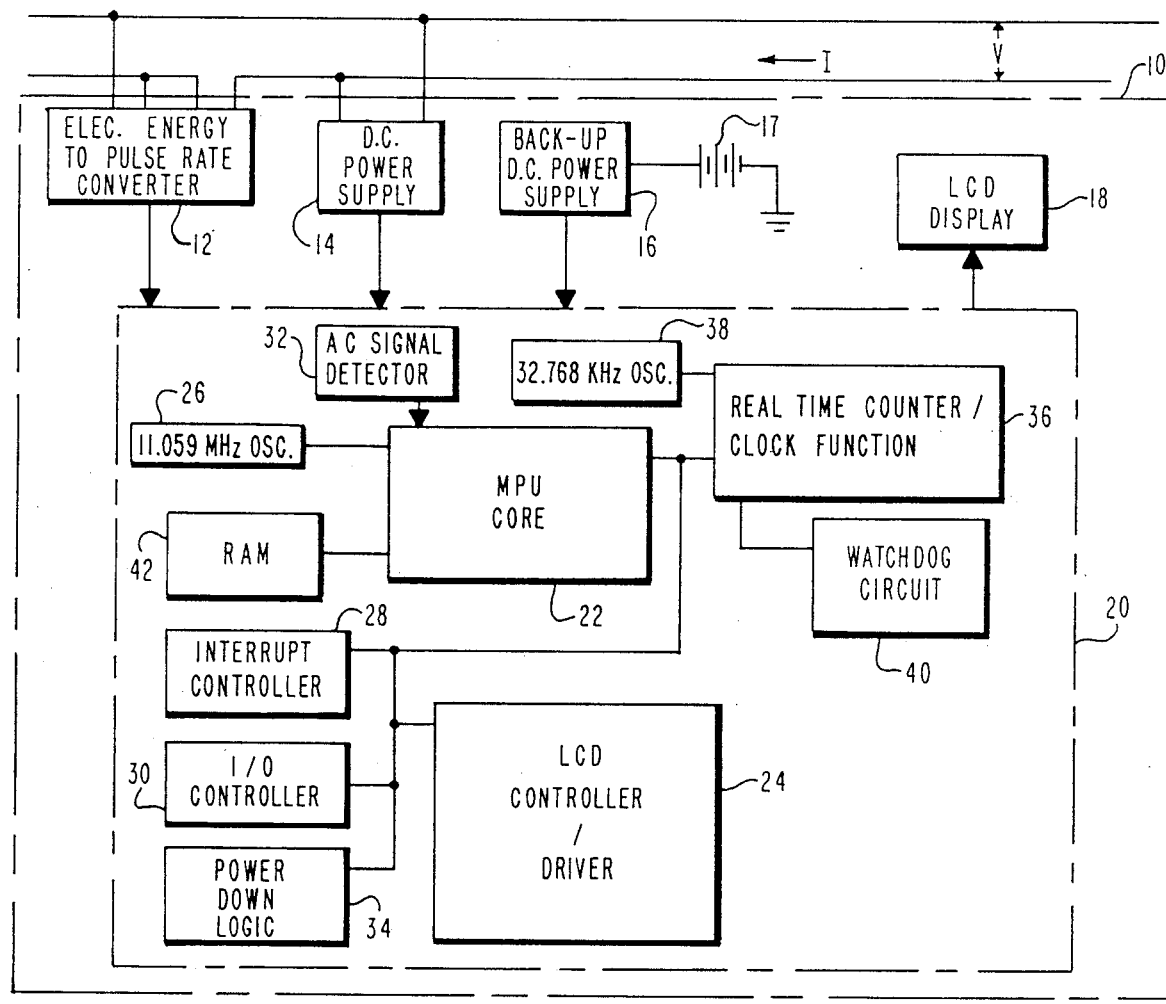
FIG. 1 is a functional block diagram of an embodiment of the electric energy meter, and particularly of the power outage recovery circuit, of the present invention.

For the purposes of promoting an understanding of the principles of the invention, reference will now be made to the embodiment illustrated in the drawings and specific language will be used to describe the same. It will nevertheless be understood that no limitation of the scope of the invention is thereby intended, such alterations and further modifications in the illustrated device, and such further applications of the principles of the invention as illustrated therein being contemplated as would normally occur to one skilled in the art to which the invention relates.

Referring first to FIG. 1, there is shown an AC electric energy meter 10 which includes a logic control circuit 20. The electric energy meter 10 includes an electrical energy to pulse rate converter 12 which is connected in a standard fashion across a source of 60 Hz AC voltage V and current I. The converter 12 provides pulses to the logic control circuit 20 corresponding to the rate of AC electric energy usage. The converter 12 may comprise a standard pulse initiator or other conventional means for producing energy pulses. Also connected across the AC line is a primary DC power supply 14 which is used to produce a constant DC voltage to the logic control circuit 20. The electric energy meter includes a backup, or more particularly a secondary power supply 16 with a battery 17 to provide low current power to the logic control circuit in the event the 60 Hz AC signal from the AC source ceases during a power failure.

The method 10 also includes a display 18 for displaying time-of-use or demand information generated by the logic control circuit 20. In the preferred embodiment, the display 18 is an LCD or liquid crystal display, although other suitable means may be utlized for displaying data from the logic control circuit. The components mentioned thus far are generally standard and well known in the field of electric energy meters and particularly in the field of electronic demand and tariff registers. The logic control circuit includes a microprocessor core 22 which operates as the heart of the logic control circuit. In the preferred embodiment, the microprocessor core is an Intel 8051 that includes an internal ROM, an internal RAM, and a power-down mode, and that is capable of serial communications. The MPU core 22 provides multi-function logic operations and includes software specifically adapted for generating time-of-use, demand, and rate or tariff data for display on the LCD display 18. The MPU core 22 includes software for storing specific programmable time-related events and for monitoring realtime for the occurrence of an event. For instance, in a typical complex tariff register, these time-related events may include programmed days of the month in which the register performs self-reading functions, seasonal changes, holidays, daylight savings changes, leap year, and various billing rate schedules (weekday/weekend rate schedules).

The MPU core 22 provides information to an LCD controller/driver 24 which is, in the preferred embodiment, a 23×4 driver. The controller/driver 24 is responsible for interfacing directly with the LCD display 18. Data is written from the MPU core 22 directly into the controller/driver 24 where it is stored until the display is to be changed. The timekeeping and communications functions of the MPU core 22 is driven by an 11.059 MHz crystal oscillator 26. The logic control circuit 20 further includes an interrupt controller 28 which is used for multiplexing the various interrupts into the MPU core 22. An I/O controller 30 is also provided to control the input and output functions of the MPU core 22. These elements 28 and 30 of the logic control circuit 20 are generally well known in the field.

The realtime clock functions of the logic control circuit 20 are managed by a realtime clock calendar within the MPU core 22. During the normal power mode, that is when full AC power is received from the AC source, the MPU core realtime clock is driven by the 60 Hz line frequency of the AC signal. This realtime clock acts as a standard wall clock and calendar to maintain the realtime and date for use in connection with the pre-programmed time-related events. Moreover, the realtime clock of the MPU core 22 is used in performing time-of-use and demand claculations of data for display or communication outside the electric energy meter 10.

Figure 2:
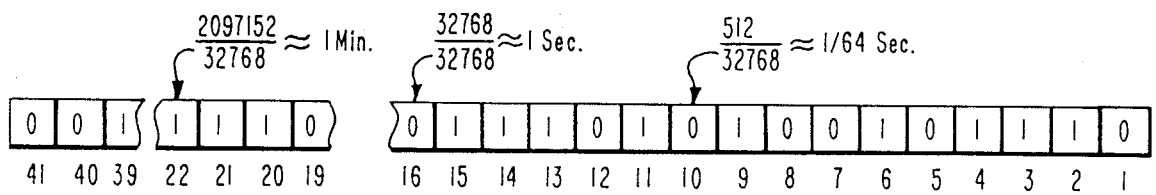
FIG. 2 is a diagram of the 41-bit ripple counter used in the power outage recovery circuit of the electric energy meter of FIG. 1.

The logic control circuit 20 further includes a secondary timer means comprising realtime counter 36 which is driven by a 32.768 kHz crystal oscillator 38. The oscillator 38 is capable of operating at a voltage of 2.5 volts, which is considerably lower than the operating power required for the 11 MHz crystal oscillator 26. The realtime counter 36 is a 41-bit ripple counter composed of a series of a toggle flip-flops. The ripple counter 369 is capable of being frozen in a particular bit state, read, cleared or allowed to run continuously from zero or from a non-zero bit state. In the read mode, the microprocessor core 22 freezes the realtime counter 36 in its current state, waits for a prescribed period of time, preferably 400 nano-seconds, and then reads the value of the counter into a memory. Once the counter 36 has been read by the MPU core 22, it can then be cleared or allowed to run from the current state. In the run mode, the 41-bit ripple counter 36 is activated with each signal from the 32 kHz oscillator.

the realtime ripple counter 36 is illustrated in bit form in FIG. 2. The ripple counter 36 is preferably a 41-bit toggle flip-flop counter, a s described. The least significant bit is triggered with each cycle of the 32 kHz oscillator 38. The 41 bits of the realtime counter 36 permit the counter to store up to approximately 2 years of realtime ($2^{41}/32768$). For the standard realtime functions of the electric energy meter 10, the least significant bit of concern is bit 9 of the ripple counter, as shown in FIG. 2, which corresponds to a realtime unit of time of 1/64 seconds ($2^{12}/32768$). Bit 15 of the ripple counter 36 corresponds to a unit of time of 1 second ($2^{15}/32768$). Bit 21 of the ripple counter corresponds roughly to a realtime interval of slightly over one minute. Thus, the ripple counter 36 directly maintains realtime based upon the binary state (zero or one) of each toggle flip-flop of the counter. The state of each flip-flop can be read by the MPU core 22 and converted into a format readily usable by the MPU timekeeping software routines, such as a binary to decimal conversion.

Referring again to FIG. 1, the logic control circuit 20 includes an AC signal detector 32 which monitors the 60 Hz signal from the AC source. The AC signal detector senses the presence of the 60 Hz above a threshold voltage. The AC signal detector 32 generates a timing signal at every cycle (1/60 sec.) of the 60 Hz AC signal fed to the logic control circuit. The logic control circuit 20 further includes power down logic 34 which issues an interrupt to the MPU core 22 in the event that a power fail condition has been detected, as described more fully below. The interrupt generated by the power down logic 34 causes the MPU to enter the power down mode and causes other components of the logic control circuit 20 to become active. For instance, the power down logic 34 senses that the MPU core 22 is in the power down state and is operable to insure that the core and the remaining components of the logic control circuit 20 power down in an orderly fashion.

Several components of the logic control circuit 20, such as the watchdog circuit 40, the counter 36, the power down logic 34 and the AC signal detector 32, and including several software routines stored within the MPU core 22, are inter-related and function as a power outage circuit for the electric energy meter 10 of the present invention. More particularly, these components of the power outage circuit operate according to the flowchart in FIGS. 3A-B. In the event power fails (conditional step 50), the primary DC power supply 14 detects the outage and issues a power outage signal to the logic control circuit 20 and control is trasnferred to the power down sequence of the power outage recovery flowchart. In the power down sequence, the power down logic 34 operates in conjunction with logic based in the MPU core 22 in step 51 to download the current realtime clock time into a secondary memory, such as the RAM 42. Simultaneously, the MPU core 22 issues a reset to the ripple counter 36 in step 52 so that the ripple counter can begin accumulating the amount of time that the power outage is maintained. In step 53, which preferably occurs generally simultaneously with step 52, the secondary DC power supply 16 is activated to provide power to the oscillator 38 and realtime counter 36, the 11 MHz oscillator clock signal is disabled and the MPU core 22 is shut down. Power from the secondary DC power supply 16 can also provided to the RAM 42 to maintain the data stored therein until the AC energy signal resumes.

Figure 3A:
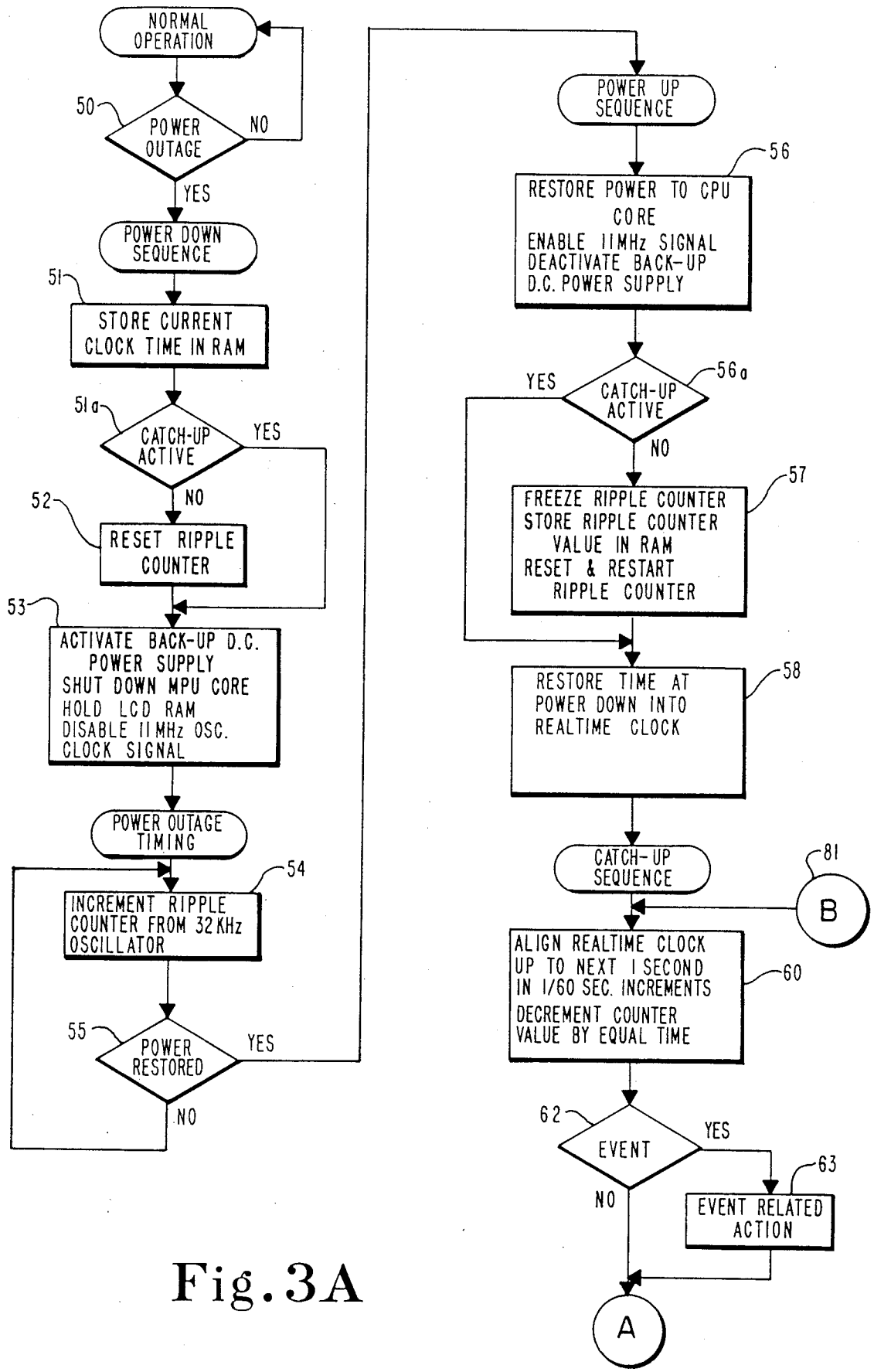
FIG. 3A illustrates a flowchart diagram of a sequence of operations of the power outage recovery circuit of the meter of FIG. 1.

During the power outage, realtime is maintained by the ripple counter 36 according to steps 54 and 55 of the flowchart of FIG. 3A. In these steps, the ripple counter is incremented according to the time base of the 32 kHz oscillator 38, until AC power is restored. If AC power is restored, the watchdog circuit 40 issues a reset which will signal the end of the power outage for conditional step 55 to transfer control to the power up sequence of the flowchart commencing with step 56.

In step 56 of the power up sequence, the secondary DC power supply 16 is deactivated and power through the re-energized DC supply power 14 is restored to the MPU core 22. The 11 MHz oscillator 26 is also enabled to perform the timekeeping functions for the MPU core 22. Once power is restored to the MPU core 22, the ripple counter 36 is frozen, the value of the ripple counter is stored in temporary memory, preferably in RAM 42, and the counter is reset (that is each of the 41 bits of the counter is set to zero) and the counter re-started in step 57,. In the preferred embodiment, the ripple counter 36 continues to operate after the reset. The value of the realtime clock at the time in which the power outage occurred is restored in step 58 from the RAM 42 into the realtime clock of the MPU core 22 to represent the new realtime clock value for the realtime functions of the MPU core 22. It is understood tht the time registered by the realtime clock at this point is not the current time but the clock calendar time at which the power outage occurred.

The power up sequence continues in a "catch-up" mode commencing with step 60 of the flowchart of FIG. 3A. The object of the "catch-up" mode is to rapidly increment the MPU realtime clock and calendar to account for the period fo time lost to the meter 10 during power outage. Although no energy was being used during this lost time (because not AC electric energy was being provided to the meter), cetain of the time-related events may have occurred which would impact the activities of the logic control circuit 20 and meter 10. Thus, it is the object of the "catch-up" mode of the power outage recovery circuit to rapidly increment the MPU realtime clock while the software within the MPU core 22 continually monitors each new realtime clock value to determine whether a time-related event has occurred. If so, the MPU core 22 performs the function called for by the time-of-use or demand programming of the meter according to that time-related event.

In step 60 of the catchup mode, the value of the realtime ripple counter 36, which had been stored in RAM 42 in step 57, is read to the nearest 1/64 second. That is, referring to FIG. 2, the state of the bits of the ripple coutner between bits 10 and 15 are read by the MPU core 22 and converted to a number of 1/60 second units of time (from the 1/64 second units measured by the binary counter). The realtime clock is aligned to the nearest second.by incrementing the clock by a number of 1/60 second units. At the same time, the value of the realtime counter stored in RAM 42 is decremented by the same amount. The MPU core 22 then reads the newly incremented realtime to determine whether a time-related event has occurred in conditional step 62. If an event has occurred, the core software routines take the appropriate action in step 63.

If no time-related event has occurred, control is passed to the next step 64 in which the stored value of the realtime counter is aligned to the nearest one minute. The state of bits 16 to 21 of the ripple counter 36 is also read to determine the portion of one minute, in one second time units, that was measured by the ripple counter 36 during the power outage. The realtime clock within the MPU core 22 is incremented in step 65 by a portion of a single minute, that is by a number of one second time units. Simultaneously, the value of the counter stored in RAM 42 is decremented by the same number of units. At this stage, then, the value of the ripple counter that was carried over to the RAM 42 has been decremented by the number of one second and 1/60 second units of time that had been maintained by the ripple counter 36 during the power outage.

Once again, a conditional step 66 determines whether a time-based event has occurred, in which instance the MPU core 22 performs the appropriate function according to step 67. In step 68, the remaining stored value of the realtime counter is read, which roughly corresponds to reading the state of the bits 22–41 from the ripple counter in one minute units of time. Thus, the total number of minutes counted by the ripple counter 36 is stored in temporary memory in the MPU core 22. In step 68, the realtime clock of the MPU core 22 is incremented by one minute every one second of current or actual realtime. The one second of realtime is determined by the 60 Hz line frequency fed to the MPU core 22. At the same time that the realtime clock of the MPU core 22 is incremented, the stored value for the ripple counter in RAM 42 is decremented by one minute every second of current realtime.

For each minute recovered in the MPU core realtime clock corresponding to a minute lost during the power outage, the conditional step 70 determines whether a time-related event has occurred, in which case the appropriate functions are performed in step 71. In conditional step 72, the stored value of the counter 36 is surveyed to determine whether the one minute increment has depleted the stored value of the ripple counter to the nearest minute—that is, to determine whether the nearest one minute increment of the stored realtime counter has been fully decremented in step 69. If not, then additional minutes are remaining within the temporary stored value of the realtime counter and control is returned to step 68–72.

If the counter value to the nearest one minute has been read and decremented, the program flow passes to step 73 in which the remaining, or residual, time of the stored value of the ripple counter is read into temporary memory in the MPU core 22. Step 74 resolves any 1/60 second and 1 second counts left over from the previous steps. Steps 75 and 76 then review the updated value of the realtime to determine whether a time-related event has occurred and the appropriate actions are taken. In conditional step 77, the stored value of the realtime counter in RAM 42 is surveyed to determine whether the stored value has been completely decremented to a value of zero (0). If not, then control is returned to steps 74–77 until the ripple counter value has been fully decremented and the MPU realtime clock has been fully incremented or updated to account for the realtime lost during the power outage.

During the "catch-up" mode of the preferred embodiment, the realtime ripple counter 36 continues to be driven by the 32 kHz oscillator 38, thus maintaining its realtime clock function during the "catch-up" mode. The MPU core 22 realtime clock is prefearbly not yet operating, so that it is necessary that the counter 36 be permitted to continue running and continue measuring realtime during the "catch-up" mode. Once the remaining time in the stored value corresponding to the realtime counter in RAM 42 has been completely decremented, that is when conditional step 77 is satisfied, control is passed to step 78 in which the new value of the ripple counter 36 corresponding to the amount of realtime elapsed during the "catch-up" mode is stored in the RAM 42.

In conditional step 79 the most significant non-zero bit of the stored value for the realtime counter is analyzed to determine whether the counter value corresponds to a unit of time less than 1/64 second. Thus, as shown in FIG. 2, if each of the bits 16-41 are 0, the value in the realtime counter corresponds to a time of less than the prescribed time unit. Time in the realtime counter below this threshold value is determined to be negligible since it is less than the minimum time measured by the MPU core realtime clock and calendar. In this instance, the "catch-up" mode is completed and the MPU realtime clock has fully recovered to register the actual current time. Control is passed to step 80 in which the MPU core 22 realtime clock and calendar is restarted from its newly updated time.

Figure 3B:
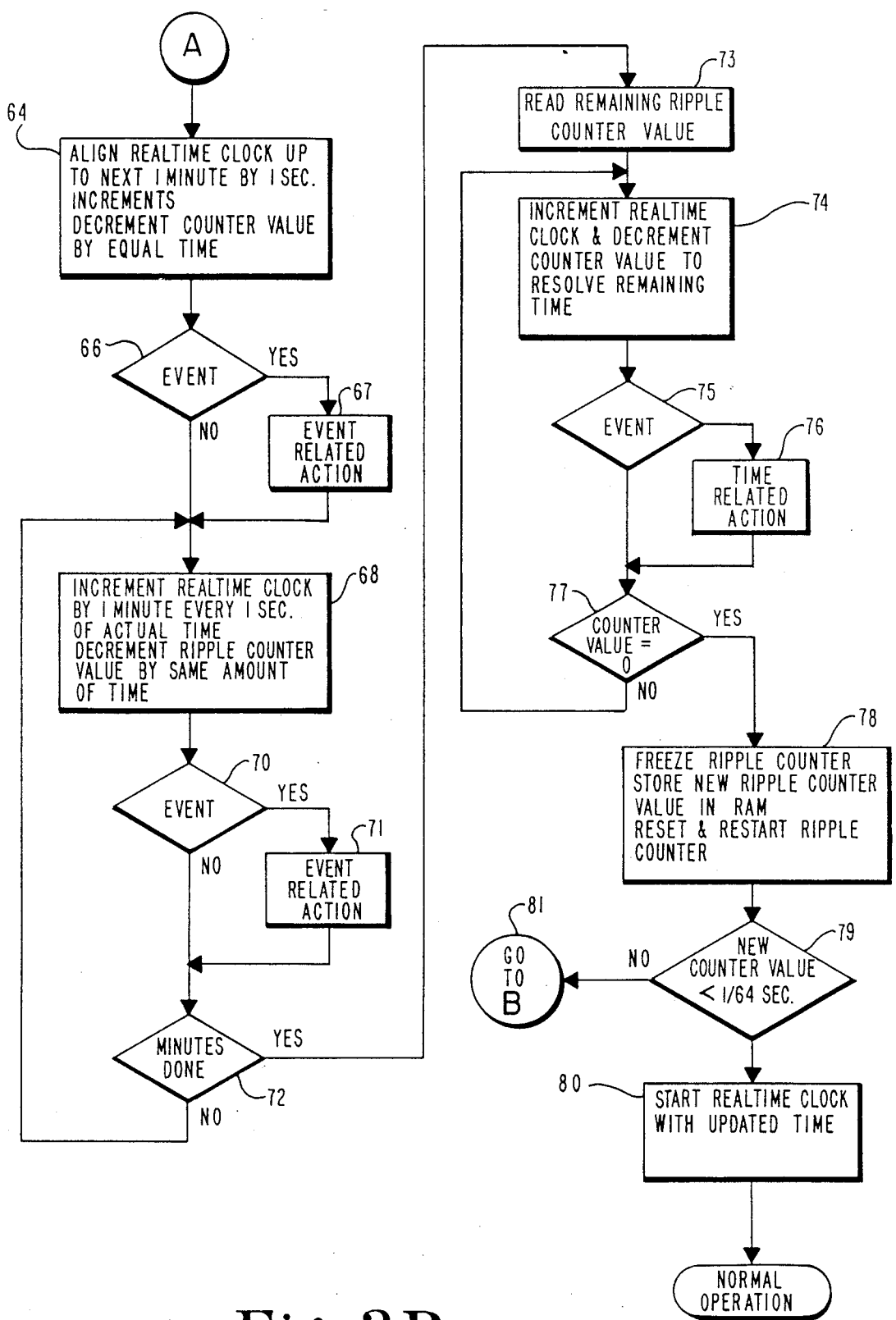
FIG. 3B is a continuation of the flowchart of FIG. 3A.

On the other hand, if conditional step 79 is negative, that is if the new value for the ripple counter stored in step 78 is greater than 1/64 seconds, program control is returned at transfer point 81 in the flowcharts of FIGS. 3A and 3B. Thus, an iterative loop is formed between steps 60 and 79 in which the realtime rippler counter 36 is repeatedly read into the RAM 42 and decremented until the stored value for the counter is zeroed while the MPU realtime clock is correspondingly incremented. This iterative process continues until the realtime counter 36 is incremented to less than 1/64 seconds during the "catch-up" cycle of step 60-79.

The power outage recovery circuitry and logic of the meter 10 and logic control circuit 20 of the present invention represents a novel improvement over the prior methods of recovering realtime lost during power outages. One advantage is that the present invention does not require significant amounts of additional hardware, so that the package size for the logic control circuit 20 is not greatly increased of a meter having no realtime recovery features. Another advantage is that the circuitry of the present invention permits a "catch-up" mode in which the time lost during the power outage and any time-related events occurring during that power outage time are completely accounted for.

Another advantage of the power outage recovery circuit of the present invention is manifested when a second power outage occurs during the "catch-up" mode. In this instance, the updated realtime clock with MPU core 22 is stored back into RAM 42 along with the current state of the ripple counter 36. A separate bit or indicator within the RAM 42 is activated to indicate that a second power failure has occurred and that, therefore, an additional value for the realtime ripple counter has been stored within RAM 42. Once power is restored, the MPU core "catch-up" routine is re-instituted according to the flowcharts of FIGS. 3A and 3B, with the recently stored value of the updated realtime counter being returned to the realtime counter temporary memory in the MPU core 22. At this point, the steps of the flowcharts are followed for the value of the ripple counter stored in RAM 42. Once that value has been decremented to zero, control passes to step 78 according to the flowcharts of FIGS. 3A and 3B. In the meantime, the ripple counter 36 has been counting the time spent during the "catch-up" mode and the last power outage(s). Catch up continues according to the flow charts of FIGS. 3A and 3B.

The power outage circuitry of the present invention, including the power outage realtime registration and recovery functions, defers the high power requirement operations of the MPU core 22 and other components of the logic control circuit 20 until after AC power has been restored. The MPU core 22 is disabled or shut down in the power outage mode. The primary components of the logic control circuit 20 requiring power are the external RAM 42, the oscillator 38 and the realtime rippler counter 36. Internal RAM of the MPU core 22 may also require low level DC power to maintain the memory contents. No other housekeeping or timekeeping functions are being performed during the time period of the power failure. Each of these components can be maintained by a 2.5 V, 60 micro-amp lithium battery 17 of the secondary DC power supply 16. The battery preferably has a temperature range of −40° to 85° C. so that it maintains its integrity in the harsh environment of the typical electric energy meter.

Once power is restored, the MPU core 22 is re-energized and resumes its normal functions, such as registering usage of the electric energy quantity. The 32 kHz oscillator 38 and ripple counter 36 can be in continuous operation during the normal operating mode of the meter 10. Alternatively, the ripple counter 36 may be frozen in a particular state during the normal operation mode of the meter 10; however, freezing the ripple counter can have some effect on other background functions of the MPU core 22 unrelated to the power outage functions described above.

In the preferred embodiment, the ripple counter 36 is driven by a 32.768 kHz oscillator. In other embodiments, the ripple counter and oscillator frequency may be altered in order to suit the needs of the particular logic control circuit 20. However, it is preferable that the crystal oscillator 38 have a frequency of some power of 2 in order to be properly matched will the flip-flop rippler counter 36. In the preferred embodiment, the logic control circuit 20 is an application specific integrated circuit based upon an Intel 8051 microprocessor core. Other similar integrated circuits may be used and programmed to accomplish the same functions While the invention has been illustrated and described in detail in the drawings and foregoing description, the same is to be considered as illustrative and not restrictive in character, it being understood that only the preferred embodiment has been shown and described and that all changes and modifications that come within the spirit of the invention are desired to be protected.

What is claimed is:

1. A method for recovering realtime lost during an outage of an AC energy quantity being measured by an electric energy meter, the meter having a primary DC power supply energized by the AC energy quantity and a microprocessor, energized by the primary DC power supply, for generating AC energy quantity usage information based upon a number of time-related event clock calendar times and for maintaining realtime by a realtime clock driven by the frequency of the AC energy quantity being measured, comprising the steps of:

storing in non-volatile memory the time at which the outage occured as registered by the realtime clock;

disabling the microprocessor;

starting a ripple counter energized by a secondary DC power supply and driven by a secondary frequency source;

upon resumption of the AC energy quantity;

enabling the microprocessor;

storing the value of the ripple counter in memory;

restoring the stored time at which the outage occurred into the microprocessor realtime clock; and thereafter, iteratively incrementing the realtime clock by progressively larger units of time while decrementing the stored value of the ripple counter by amounts corresponding to equal units of time until the stored value of the ripple counter has been decremented to zero;

comparing the incremented time registered by the realtime clock during the iterative step with the number of time-related event clock calendar times for generating AC energy quantity usage information; and restarting the realtime clock.

2. The method for recovering realtime according to claim 1 further comprising the steps:

upon resumption of the AC energy quantity and after the step of storing the value of the ripple counter in memory, resetting and restarting the ripple counter to measure the time duration of the iterative step and comparing step until the stored value of the ripple counter has been decremented to zero;

storing the new value of the ripple counter in memory once the prior stored value has been decremented to zero;

repeating the iterative and comparing steps with the new stored value of the ripple counter.

3. The method for recovering realtime according to claim 1 further comprising the steps:

sensing a second outage of the AC energy quantity during the iterative and comparing steps;

upon sensing the second outage, storing the iteratively incremented time registered by the realtime clock into non-volatile memory;

upon a second resumption of the AC energy quantity;

restoring the stored iteratively incremented time into the microprocessor realtime clock; and repeating the iterative and comparing steps.

4. A power outage recovery circuit for recovery of realtime lost during an outage of an AC energy quantity for use in a time registering electric energy meter measuring usage of the AC energy quantity, the meter including a primary DC power supply energized by the AC energy quantity, a separate secondary DC power supply and a microprocessor for registering realtime and for generating AC energy usage information determined by a number of time-related event clock calendar times stored in non-volatile memory, the microprocessor having a realtime clock driven by the frequency of the AC energy quantity, the power outage recovery circuit comprising:

means for generating an outage signal upon detection of an outage of the AC energy quantity;

means for generating a resumption signal upon resumption of the AC energy quantity;

means responsive to said outage signal for storing in non-volatile memory a first time according to the realtime clock corresponding to the time when the outage occurred;

secondary timer means for measuring the time duration of the outage between receptions by said secondary timer means of said outage signal and said resumption signal, said secondary timer means being energized by said secondary DC power supply;

recovery means, responsive to said resumption signal, for updating the microprocessor realtime clock after resumption of the AC energy quantity to account for the time duration of the outage, said recovery means including;

means for restoring said first time from said non-volatile memory into the microprocessor realtime clock;

means for storing a second time corresponding to the time duration measured by said secondary timer means;

updating means for iteratively updating the realtime clock by incrementing the realtime clock in progressively larger units of time and decrementing said stored second time by equal units of time until the value of said second time has been decremented to zero;

means for comparing the updated realtime with the number of time-related event clock calendar times while the realtime clock is iteratively updated by said updating means; and means for restarting the microprocessor realtime clock after resumption of the AC energy quantity.

5. The power outage recovery circuit of claim 4, wherein said recovery means further includes:

means for successively operating said recovery means until the realtime clock has been updated to the current time to account for the realtime during the prior updating of the realtime clock by the recovery means;

means for resetting and restarting said secondary timer means at the beginning of each successive operation of said recovery means to measure a third time corresponding to the time duration of each iterative operation of said recovery means, wherein in the next successive operation of the recovery means said third time is stored in said secondary memory and iteratively decremented to zero while the realtime clock is correspondingly incremented by said recovery means unless said third time is less than a predetermined threshold time value; and said means for restarting the microporcessor realtime clock is only operable to restart the realtime clock after the realtime clock has been updated to the current time.

6. The power outage recovery circuit of claim 4, wherein said secondary timer means includes:

means for generating a secondary timing signal at a frequency different from the frequency of the AC energy quantity; and a binary ripple counter drivern by said secondary timing signal.

7. The power outage recovery circuit of claim 6, wherein said binary ripple counter is a 41-bit counter.

8. The power outage recovery circuit of claim 4, wherein said recovery means includes:

means for resetting and restarting said secondary timer means after said second time has been stored; and means for storing a third time corresponding to the time registered by said secondary timer after said stored second time has been decremented to zero by said updating means, wherein said updating means is operable to iteratively update the realtime clock according to the stored third time.

9. The power outage recovery circuit of claim 4, wherein said recovery means includes a stored program in the microprocessor.

10. A time registering electric energy meter for measuring usage of an AC electric energy quantity comprising:

a primary DC power supply energized by the AC energy quantity;

a separate secondary DC power supply;

a microprocessor, energized by said primary DC power supply, for maintaining realtime clock calendar information while the AC electric energy is being measured and for generating AC energy usage information determined by a number of time-related event clock calendar times stored in a non-volatile memory, said microprocessor including a realtime clock for registering the time, said realtime clock being driven by the frequency of the AC energy quantity;

detecting means for detecting an outage of the AC energy quantity and for detecting the restoration of the AC energy quantity;

means responsive to detection of an outage by said detection means for storing the time of the outage registered by the realtime clock in a non-volatile memory energized by said secondary DC power supply;

secondary timer means, energized by said secondary DC power supply, for measuring the time duration of the outage, said secondary timer means including;

means for producing secondary time base signals; and counter means, responsive to said detecting means, for counting said secondary time base signals between detection of an outage and detection of a resumption of the AC energy quantity;

recovery means, responsive to the detection of a resumption of the AC energy quantity, for updating the realtime clock to account for the time duration of the outage, said recovery means including;

means for storing the value of said counter;

first means for decrementing said stored value by a first amount equivalent to a number of first units of time to the nearest minute and for incrementing the realtime clock by an equal number of first units of time ;

second means for decrementing said stored value by a second amount equivalent to a number of one minute units of time to the nearest hour and for incrementing the realtime clock by an equal number of one minute units of time;

third means for decrementing said stored value of said counter by a third amount equivalent to a number of third units of time until the stored value has been decremented to zero and for incrementing the realtime clock by an equal number of third units of time;

means for comparing the time registered by the realtime clock while the realtime clock is being incremented by said first, second and third means, with the number of time-related event clock calendar times; and means for restarting the microprocessor realtime clock after said stored value of the counter has been decremented to zero.

11. The time registering electric energy meter of claim 10, wherein said recovery means is energized by said primary DC power supply.

12. The time registering electric energy meter of claim 10, wherein said counter means includes a 41-bit binary ripple counter.

13. The time registering electric energy meter of claim 10, wherein said recovery means includes a stored program in said microprocessor.

14. The time registering electric energy meter of claim 10, wherein said means responsive to detection of an outage includes means for disabling said microprocessor.

15. The time registering electric energy meter of claim 10, wherein said separate secondary DC power supply includes a battery providing a voltage of less than 4.0 volts and a current of less than 100 micro-amps.

* * * * *